(12) United States Patent
Salter et al.

(10) Patent No.: US 10,124,767 B1
(45) Date of Patent: Nov. 13, 2018

(54) VEHICLE EXTERIOR KEYPAD HAVING INTERIOR LAMP

(71) Applicant: Ford Global Technologies, LLC, Dearborn, MI (US)

(72) Inventors: Stuart C. Salter, White Lake, MI (US); Paul Kenneth Dellock, Northville, MI (US); Cornel Lewis Gardner, Romulus, MI (US); Aaron Bradley Johnson, Allen Park, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/882,191

(22) Filed: Jan. 29, 2018

(51) Int. Cl.
| | |
|---|---|
| *B60R 25/23* | (2013.01) |
| *H03K 17/96* | (2006.01) |
| *G06F 3/02* | (2006.01) |
| *B60Q 3/00* | (2017.01) |

(52) U.S. Cl.
CPC ............ *B60R 25/23* (2013.01); *G06F 3/0219* (2013.01); *H03K 17/9622* (2013.01); *B60Q 3/00* (2013.01)

(58) Field of Classification Search
CPC ....................................................... B60R 25/23
USPC ................................................. 340/5.5–5.55
See application file for complete search history.

(56) References Cited

U.S. PATENT DOCUMENTS

| | | | |
|---|---|---|---|
| 4,494,326 A | 1/1985 | Kanamori | |
| 4,754,255 A * | 6/1988 | Sanders | B60R 25/04 180/287 |
| 5,239,152 A | 8/1993 | Caldwell et al. | |
| 6,606,492 B1 * | 8/2003 | Losey | B60R 25/04 307/10.2 |
| 6,617,975 B1 | 9/2003 | Burgess | |
| 7,151,351 B2 * | 12/2006 | Piechowiak | E05F 15/41 318/466 |
| 7,260,454 B2 | 8/2007 | Pickering et al. | |
| 7,733,332 B2 | 6/2010 | Steenwyk et al. | |
| 7,989,725 B2 | 8/2011 | Boddie et al. | |
| 8,279,194 B2 | 10/2012 | Kent et al. | |
| 8,330,385 B2 | 12/2012 | Salter et al. | |
| 8,400,265 B2 | 3/2013 | Sarioglu et al. | |
| 8,454,181 B2 | 6/2013 | Salter et al. | |
| 8,506,101 B2 | 8/2013 | Mathers et al. | |
| 8,514,545 B2 | 8/2013 | Haag | |
| 8,654,265 B2 | 2/2014 | Hung et al. | |
| 8,878,438 B2 | 11/2014 | Salter et al. | |
| 8,994,495 B2 | 3/2015 | Dassanayake et al. | |
| 9,199,608 B2 | 12/2015 | Newman et al. | |

(Continued)

FOREIGN PATENT DOCUMENTS

CN 101833404 A 9/2010

OTHER PUBLICATIONS

"Securicode Keyless Entry Keypad," https://owner.ford.com/how-tos/vehicle-features/locks-and-security/securicode-keyless-entry-keypad.html, Official Ford Owner Site, 6 pages, copyrighted 2016, Ford Motor Company.

(Continued)

*Primary Examiner* — Allen T Cao
(74) *Attorney, Agent, or Firm* — Jason Rogers; Price Heneveld LLP

(57) ABSTRACT

An input keypad assembly on a vehicle is provided and includes a keypad located on a vehicle body member and configured to receive a user input on an exterior of the vehicle, and a lamp configured to illuminate light in an interior of the vehicle.

20 Claims, 6 Drawing Sheets

(56) References Cited

U.S. PATENT DOCUMENTS

| | | |
|---|---|---|
| 2005/0190039 A1* | 9/2005 | Aoyama ............. B60R 11/0264 340/5.21 |
| 2005/0190040 A1 | 9/2005 | Huntzicker et al. |
| 2007/0194216 A1 | 8/2007 | Schwenke |
| 2007/0295043 A1 | 12/2007 | McDermott et al. |
| 2011/0291982 A1 | 12/2011 | Hsieh et al. |
| 2014/0002405 A1 | 1/2014 | Salter et al. |
| 2015/0180471 A1 | 6/2015 | Buttolo et al. |
| 2015/0360647 A1 | 12/2015 | Mathews |
| 2016/0371907 A1* | 12/2016 | Ma .......................... E05B 81/82 |
| 2017/0018129 A1* | 1/2017 | Huebner ................... B60L 3/12 |
| 2017/0204650 A1 | 7/2017 | Dezorzi et al. |
| 2018/0062649 A1 | 3/2018 | Salter et al. |
| 2018/0194203 A1 | 7/2018 | Salter et al. |

OTHER PUBLICATIONS

"Keyfree," www.keyfree.gr/index.php/productsgr/10-mkeyfree-touch, 6 pages, VSA Ltd., copyrighted Automotive Innovations.

"Touch Sensors Design Guide" by ATMEL, 10620 D-AT42-04/09, Revised Apr. 2009, 72 pages, Copyrighted 2008-2009 Atmel Corporation.

\* cited by examiner

VEHICLE EXTERIOR KEYPAD HAVING INTERIOR LAMP

FIELD OF THE INVENTION

The present invention generally relates to proximity keypad input devices, and more particularly relates to a proximity sensor key input pad with lighting.

BACKGROUND OF THE INVENTION

Automotive vehicles are commonly equipped with various user actuatable input devices for entering inputs to control the various devices or functions. For example, keypads are often provided on the vehicle body exterior to enable a user to enter a sequence of inputs as a code to actuate a door lock without a mechanical key or key fob. Conventional keypads employed on motor vehicles may include mechanical switches actuated by the user or proximity switches which may be located on a door, a window or other parts of the body of the vehicle. It may be desirable to provide for an enhanced keypad assembly that offers added functionality and performance.

SUMMARY OF THE INVENTION

According to one aspect of the present invention, an input keypad assembly on a vehicle is provided. The input keypad assembly includes a keypad located on a vehicle body member and configured to receive a user input on an exterior of the vehicle, and a lamp configured to illuminate light in an interior of the vehicle.

Embodiments of the first aspect of the invention can include any one or a combination of the following features:
the body member comprises a window;
the input keypad assembly is located in a frit region of the window;
the keypad comprises a plurality of proximity sensors positioned on a surface of the vehicle body member;
the plurality of proximity sensors comprises a plurality of capacitive sensors;
each of the capacitive sensors comprises a first plurality of electrode fingers interlaced with a second plurality of electrode fingers;
the keypad is employed to control operation of a door lock to lock or unlock a vehicle door;
the input keypad assembly further includes a character region viewable from the exterior of the vehicle for providing an illuminated character for identifying pads of the keypad;
the input keypad assembly further includes a circuit board, wherein the lamp comprises a first light source assembled on the circuit board; and
the input keypad assembly further includes a second light source assembled on the circuit board and located behind the character region for backlighting the character region.

According to another aspect of the present invention, an input keypad assembly on a vehicle is provided. The input keypad assembly includes a circuit board located on a vehicle body member, a keypad connected a first side of the circuit board and configured to receive a user input on an exterior of the vehicle, and a lamp connected on the circuit board and configured to illuminate light in the interior of the vehicle.

Embodiments of the second aspect of the invention can include any one or a combination of the following features:
the body member comprises a window;
the input keypad assembly is located in a frit region of the window;
the keypad comprises a plurality of proximity sensors positioned on a surface of the vehicle body member;
the plurality of proximity sensors comprises a plurality of capacitive sensors;
each of the capacitive sensors comprises a first plurality of electrode fingers interlaced with a second plurality of electrode fingers;
the keypad is employed to control operation of a door lock to lock or unlock a vehicle door;
the input keypad assembly further includes a character region viewable from the exterior of the vehicle for providing an illuminated character for identifying pads of the keypad;
the lamp comprises a first light source assembled on the circuit board and arranged to illuminate light outward from a second side of the circuit board; and
the input keypad assembly further includes a second light source assembled on the circuit board and located behind the character region for backlighting the character region.

These and other aspects, objects, and features of the present invention will be understood and appreciated by those skilled in the art upon studying the following specification, claims, and appended drawings.

DETAILED DESCRIPTION OF THE PREFERRED EMBODIMENTS

Figure 1:
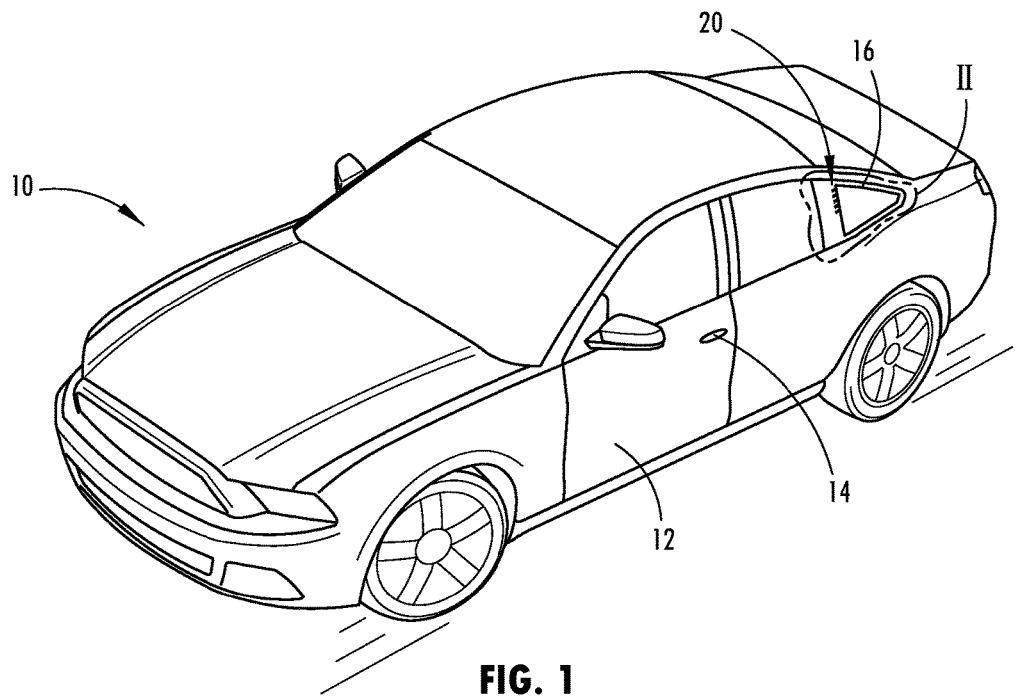
FIG. 1 is a side perspective view of a motor vehicle equipped with an input keypad assembly having an interior lamp, according to one embodiment.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Referring to FIG. 1, a wheeled motored vehicle 10 is generally illustrated having an input keypad assembly 20 shown configured as a vehicle door access keypad assembly that enables a person to enter a sequence of inputs to lock and unlock the vehicle doors, according to one embodiment. The vehicle 10 includes a passenger door 12 provided on the vehicle body and a door latch lock assembly 14 positioned on the door 12. The door latch lock assembly 14 may be actuatable by a person to unlatch and thereby open the door 12 and to lock and unlock the door 12 and other doors on the vehicle to control access to the vehicle 10. It should be appreciated that a driver may actuate a door lock switch in the vehicle 10 and may also be equipped with a key fob that may remotely lock and unlock the door latch lock assembly 14 of vehicle door 12. The input keypad assembly 20 is configured with a plurality of user selectable input keypads 22 (FIG. 2) to enable a user (e.g., person) to input a code as a sequence of user inputs to lock and unlock the vehicle door 12 by entering a programmed sequence of input characters (e.g., alphanumeric codes) via the keypads 22 labelled with the identifier characters.

Figure 2:
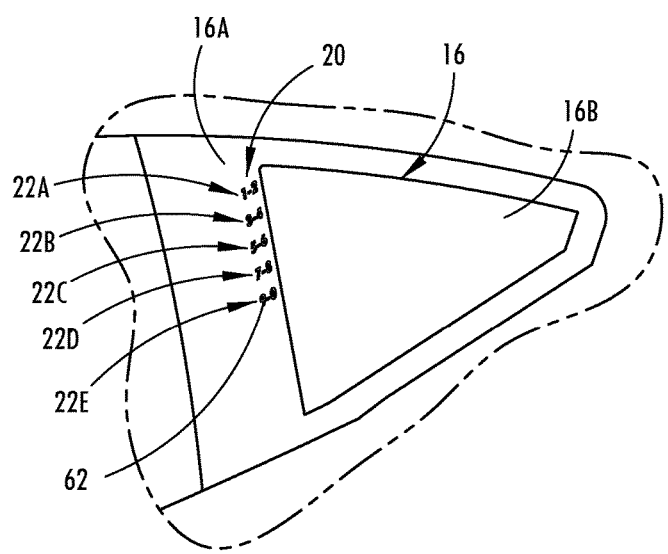
FIG. 2 is an enlarged view of section II of FIG. 1 further illustrating the input keypad assembly on the exterior side.

The input keypad assembly 20 is illustrated further in FIG. 2 having the plurality of user selectable input keypads 22A-22E shown arranged vertically on a vehicle body panel shown as a rear side window 16 adjacent to an interior rear seating arrangement and configured for receiving an exterior input by a user, according to one embodiment. The window 16 has a visually transparent viewing portion 16B that is surrounded by an opaque frit portion 16A. The opaque first portion 16A is generally not visually transparent. The input keypad assembly 20 and input keypads 22A-22E are shown located in the frit portion 16, according to one embodiment. It should be appreciated that the input keypad assembly 20 and keypads 22A-22E may be located on the visually transparent viewing portion or on other vehicle body panels such as the A, B and C pillars, doors, other windows and elsewhere, according to other embodiments.

The input keypads 22A-22E each include patterns in the form of keypad indication characters 62 that are illuminable with light such as backlighting to display a lighted character image that is viewable on the outside surface of the window 16. The input keypads 22A-22E each define a region upon which a user may touch the input keypad with a finger or come in close proximity thereto to provide a user input selection. The lighted characters 62 may be formed as transparent regions that passes light through a light blocking medium such as a printed film. The characters 62 shown include numerical characters one and two (1.2) for the first input keypad 22A, numerical characters three and four (3.4) for the second input keypad 22B, numerical characters five and six (5.6) for the third input keypad 22C, numerical characters seven and eight (7.8) for the fourth input keypad 22D, and numerical characters nine and zero (9.0) for the fifth input keypad 22E. It should be appreciated that other characters such as letters or symbols may be employed as input keypad identifiers. Each of the input keypads 22A-22E has a capacitive sensor that senses contact or close proximity (e.g., 1 millimeter) of the user's finger with the keypads 22 and defines a binary switch output (on or off) indicative a user selection of that corresponding input keypad.

The input keypads 22A-22E each include a proximity sensor shown positioned on the interior side of the glass window 16 for sensing close proximity of a user, such as a user's finger, at or near the exterior surface of the window 16 proximate an input pad. When a user, such as a user's finger, is detected in close proximity to one of the input keypads 22A-22E, all of the input keypads 22 may initially be lighted for a short time period such as several seconds and thus viewable to a user. The illumination of all of the input keypads 22 may be based on a first or lower threshold limit being exceeded by a signal generated by any one or more of the proximity sensors. When a proximity sensor associated with one of the inputs keypads detects a finger in closer proximity with a higher threshold signal, indicative of an attempted activation of the input keypad, a switch output may be generated and a feedback lighted output may be generated to illuminate that activated input keypad to indicate that the input pad has been activated. This may include activating the input keypad or lighting the input keypad in the same or a different color, according to one example.

Figure 5:
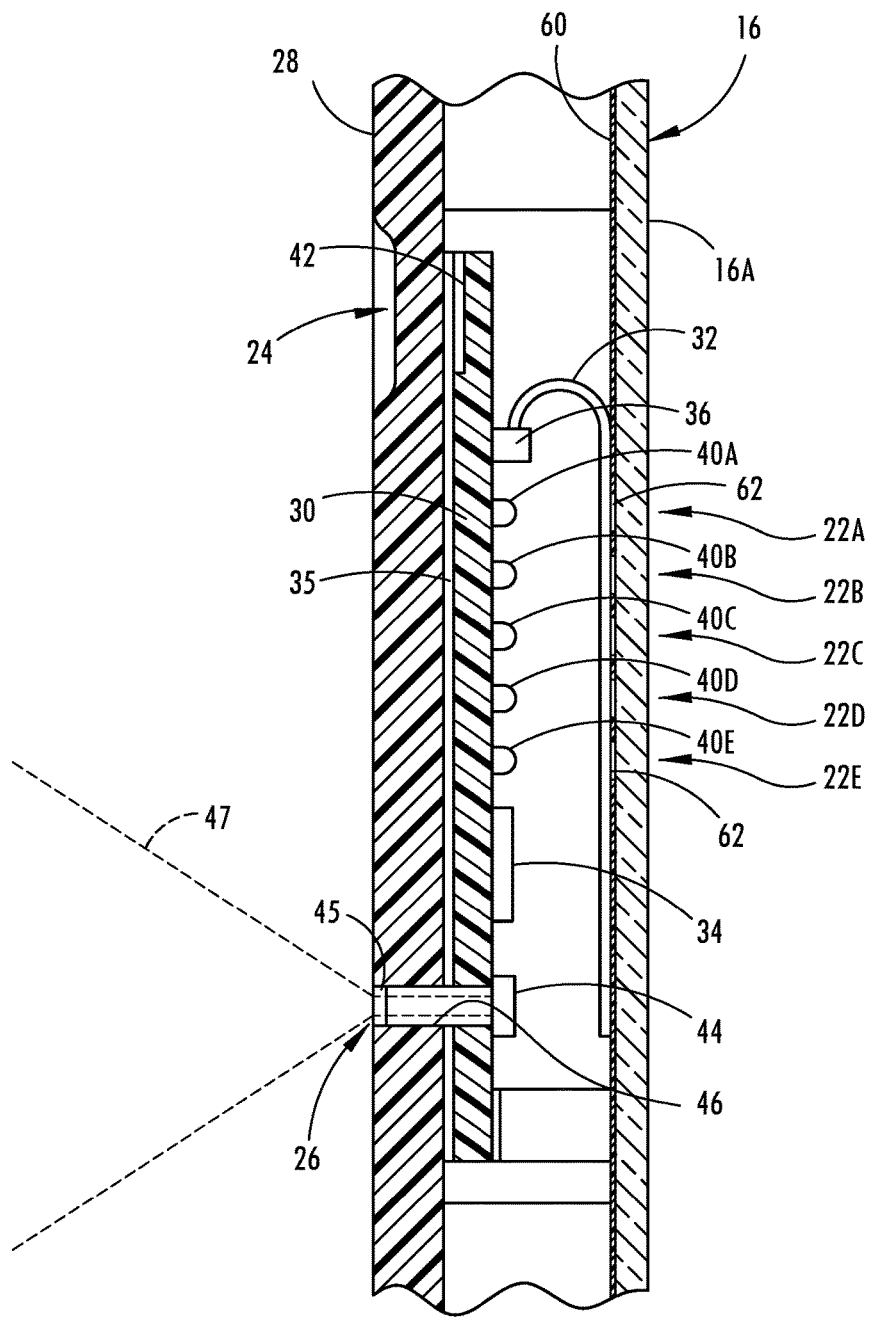
FIG. 5 is a cross-sectional view taken through line V-V of FIG. 4 further illustrating the keypad assembly.
Figure 6:
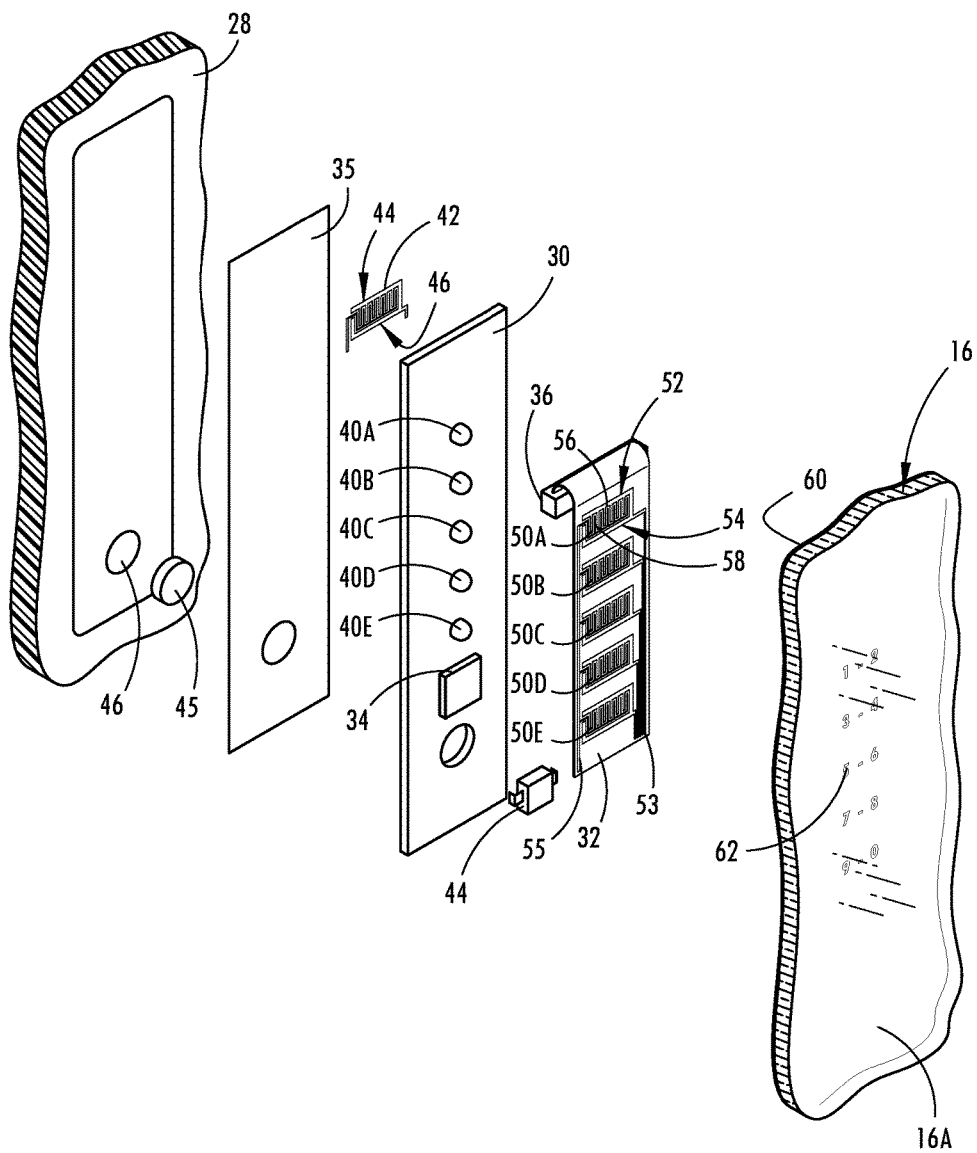
FIG. 6 is an exploded view as seen from the exterior of the capacitive input keypad assembly with the lamp.
Figure 7:
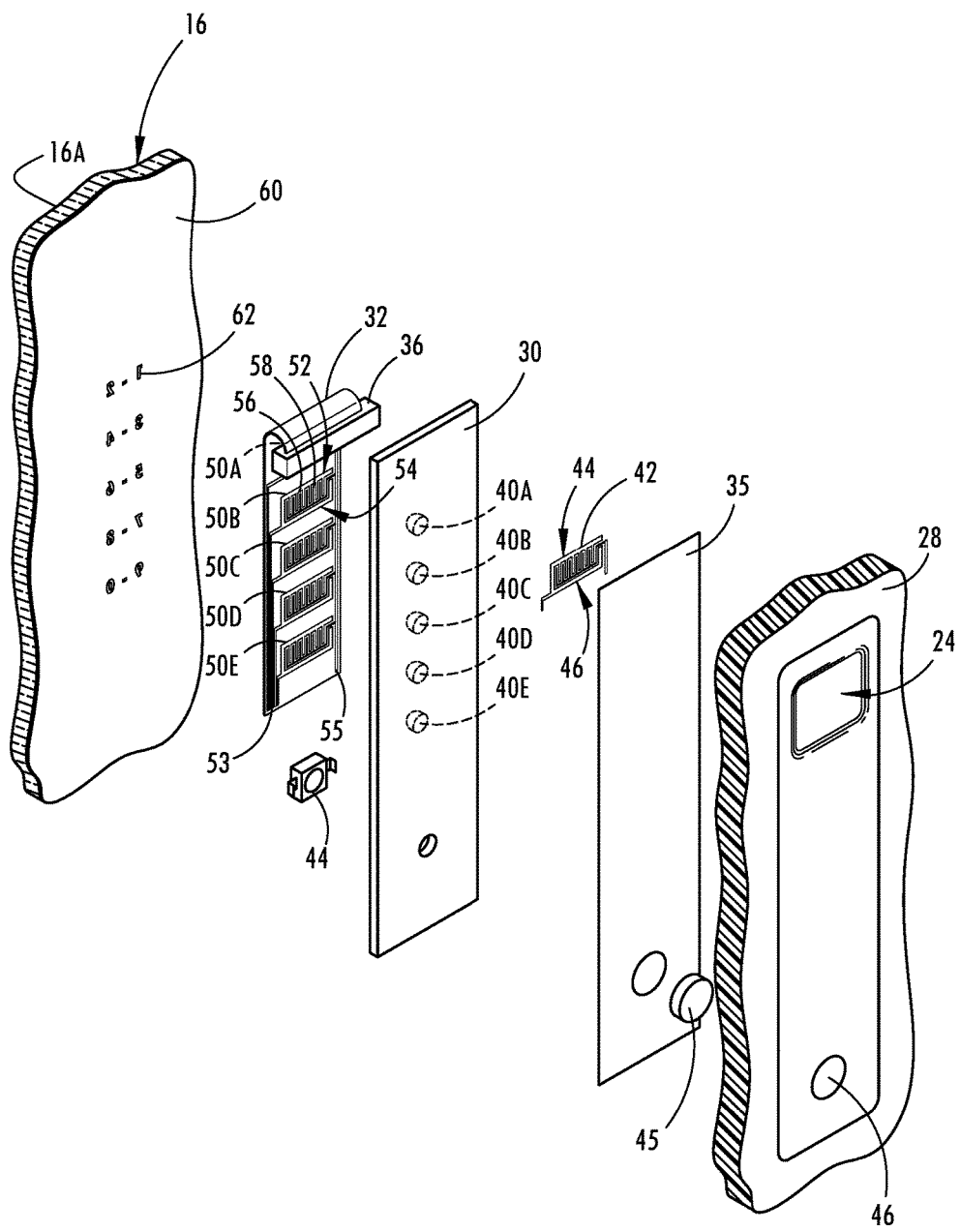
FIG. 7 is an exploded view as seen from the interior of the capacitive input keypad assembly with the lamp.

The input keypad assembly 20 is further illustrated in FIGS. 5-7 in more detail showing five proximity sensors configured as capacitive sensors 50A-50E positioned to sense an object contacting or in close proximity with the corresponding input keypads 22A-22E on or near the exterior surface of the window 16. As seen in FIGS. 6 and 7, each of the capacitive sensors 50A-50E includes a first electrode 52 and a second electrode 54. Each of the first and second electrodes 52 and 54 includes a plurality of conductive electrode fingers 56 and 58, respectively. As such, the first electrode 52 has a first plurality of electrode fingers 56 and the second electrode 54 has a second plurality of electrode fingers 28. Each of the first and second electrode plurality of fingers 56 and 58 are generally positioned to be interdigitated or interlaced with the other of the first and second plurality of electrode fingers 56 and 58 to at least some degree to generate a capacitive activation field for sensing the presence of an object such as a user's hand or finger. The first electrode 52 may be configured as a receive electrode and receives a sense signal, and the second electrode 54 may be configured as a drive electrode to receive a drive signal.

The capacitive sensors 50A-50E each provide a capacitive sense activation field to sense contact or close proximity (e.g., within one mm) of a user (e.g., finger) in relation to the corresponding capacitive sensor. The capacitive sense activation field of each capacitive sensor 50A-50E detects a user's finger which has electrical conductivity and dielectric properties that cause a change or disturbance in the capacitive sense activation field as should be evident to those skilled in the art. Each of the capacitive sensors 50A-50E provides a sense signal for a corresponding keypad 22A-22E indicative of a user input. A user may enter a sequence of user inputs on the keypads 22A-22E that match a programmed key code to lock or unlock one or more vehicle doors, according to one embodiment.

The capacitive sensors 50A-50E each generally have the first electrode 52 and second electrode 54, each having interdigitated fingers for generating a capacitive field. It should be appreciated that each of the capacitive sensors 50A-50E may be formed by printed conductive ink or by assembling preformed conductive circuitry onto a substrate such as a flexible tape. According to one embodiment, the first electrode 52 receives square wave drive signal pulses applied at an input voltage. The second electrode 54 has an output for generating an output voltage. It should be appreciated that the first and second electrodes 52 and 54 and electrode fingers 56 and 58 may be arranged in various configurations for generating the capacitive fields as the sense activation fields, according to various embodiments.

The first electrodes 52 receive drive input signals on separate drive lines 53. The capacitive sensors 50A-50E have a common output line 55 for outputting the corresponding voltage. It should be appreciated that the first and second electrodes 52 and 54 may be otherwise configured so that other types of single electrode or other multiples of electrode arrangements may be used. The input keypad assembly 20 may advantageously be formed with conductive ink or may alternatively be formed with flex circuitry. The capacitive input keypad assembly 20 may be applied to various types and sizes of input pads and characters.

In the embodiment shown and described herein, the first electrode 52 of each capacitive sensor 50A-50E may be supplied with an input voltage as square wave signal pulses having a charge pulse cycle sufficient to charge the second electrode 54 to a desired voltage. The second electrode 54 thereby serves as a measurement electrode. The adjacent sense activation fields generated by adjacent capacitive sensors may overlap slightly or overlap may not exist. When a user or operator, such as a user's finger enters a capacitive sense activation field, the corresponding capacitive sensor detects a disturbance caused by the finger to the activation field and determines whether the disturbance is sufficient to generate an input with the corresponding capacitive sensor. The disturbance of the activation field is detected by processing the charge pulse signal associated with the corresponding signal channel for that capacitive sensor. Each capacitive sensor 50A-50E has its own dedicated signal channel generating a distinct charge pulse signal which may be processed individually.

Figure 3:
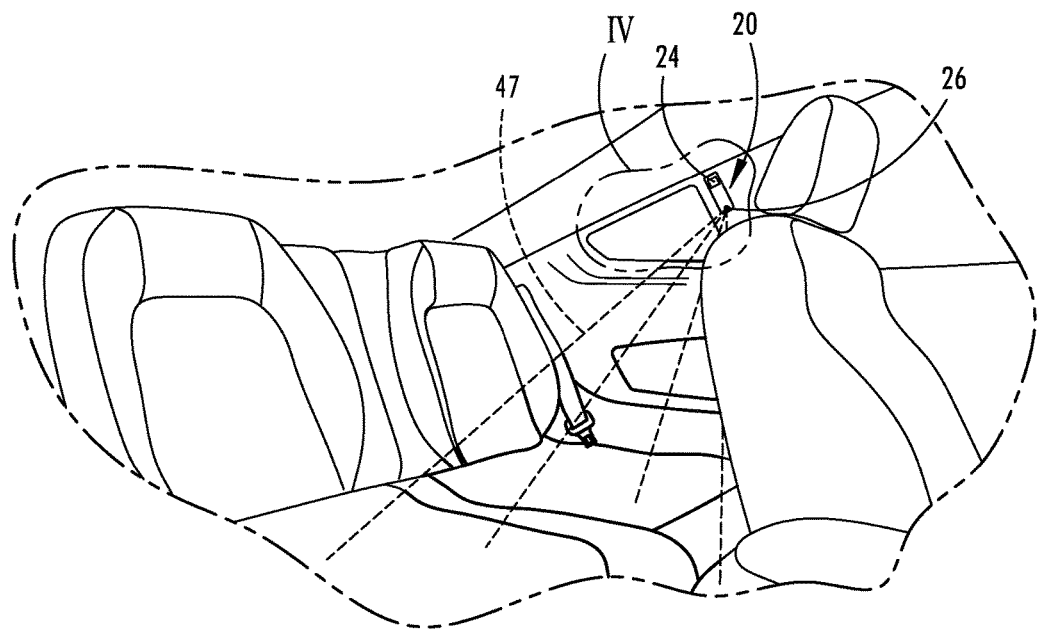
FIG. 3 is an interior perspective view of the keypad assembly further illustrating the lamp on the interior side.
Figure 4:
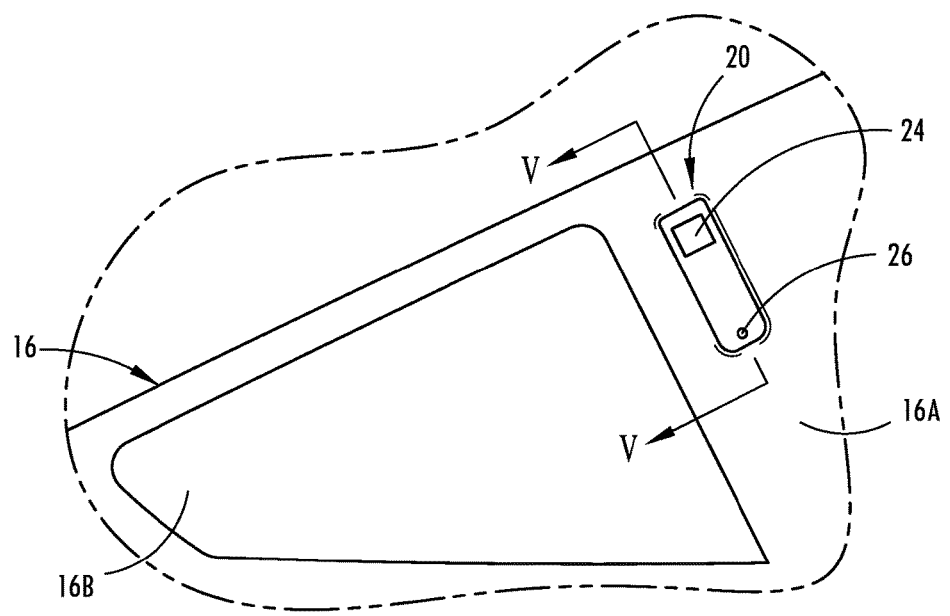
FIG. 4 is an enlarged view of section IV of FIG. 3 further illustrating the interior side of the keypad assembly with the lamp.

Referring back to FIGS. 3 and 4, the input keypad assembly 20 is illustrated having a lamp 26 configured to illuminate light in the interior of the vehicle 10. The input keypad assembly 20 is generally located in the frit portion 16A of the rear side window 16 adjacent to the rear seating arrangement in the vehicle interior, in the embodiment shown. The lamp 26 is located on the input keypad assembly 20 and oriented to illuminate light into the interior of the vehicle towards the rear seating arrangement such that the light may serve as a map or reading lamp. The lamp 26 may alternatively, or in addition, serve as ambient lighting. It should be appreciated that the lamp 26 may include one or more light sources and lenses or other optics. The input keypad assembly 20 also includes an input switch in the form of a proximate switch or, more particularly, a capacitive switch 24 which is actuatable by a user on the vehicle interior side to turn the lamp 26 on and off.

Referring again to FIGS. 5-7, the arrangement of the lamp 26 on the input keypad assembly 20 is further illustrated in more detail. The lamp 26 includes a light source 44 such as a light-emitting diode (LED) mounted on a first or exterior side of the circuit board 30. The light source 44 is aligned with a recessed hole 46 formed in the trim panel 28 and the circuit board 30. An optic device shown as a lens 45 is disposed within the recessed hole 46 and aligned with the light source 44, according to one embodiment. The lens 45 may refract the light and spread out the light illumination in a desired cone-shaped beam 47 or other shaped beam pattern. As such, the light source 44 illuminates light through the recessed hole 46 and lens 45, outward from an opposite second or interior side of the circuit board 30 and towards the interior of the vehicle. By employing a recessed hole 46, the light source 44 is hidden and serves to provide directed light as a map or reading light or an ambient light.

The capacitive switch 24 for controlling the lamp 26 is shown located on the interior side of the circuit board 30, proximate to a depressed region on the interior surface of the trim panel 28. The capacitive sensor 42 may include first and second electrodes 44 and 46 each having a plurality of interdigitated electrode fingers, similar to the capacitive sensor arrangement shown for each of capacitive sensors 50A-50E. As such, the capacitive sensor 42 generates an activation field and detects a user in close proximity to the sensor on the interior surface of the trim panel 28 to detect an activation to turn the lamp 26 on or off.

The capacitive sensors 50A-50E are shown formed on a flexible medium, such as a tape 32 which, in turn, connects at electrical connector 36 onto the exterior side of the printed circuit board 30. The flexible medium 32 thereby extends forward of a plurality of light sources 40A-40E which are mounted on the exterior side of the circuit board 30 to illuminate light generally in a region through the corresponding capacitive sensors 50A-50E to backlight the keypads 22A-22E. The light sources 40A-40E may each include an LED having a focus field of view that illuminates a dedicated one of the keypads 22A-22E and does not overlap with other of the keypads. Additionally, a controller 34 which may include a microprocessor and memory is also shown mounted on the exterior side of the circuit board 30. The light sources 40A-40E may each include read, green, blue (RGB) LEDs that may be controlled to illuminate different selectable colors of light.

Located between the interior surface of the glass window 16 and the flexible medium 32 containing the capacitive sensors 50A-50E is an opaque sheet or layer 60 having light transmissive portions that form the characters 62 aligned with each of the input pads 22A-22E. The sheet 60 may include a thin layer of paint or a tape with adhesive having an opaque surface that blocks the transmission of light and light transparent regions formed therein in a shape that form the desired character 62 for each input keypad. The transparent portions may be formed by a light transmissive medium in the tape or by a cutout or opening extending through the tape. Each of the characters 62 for corresponding input keypads are aligned with one of the light sources 40A-40E so that light may illuminate through the flexible medium 32 and proximity sensors 50A-50E and onto the back surface of the sheet 60 and illuminate through the light transmissive area forming the characters 62. As such, the characters 62 appear illuminated as viewed from the exterior surface of the window 16. In order to allow light to pass through sheet 62 and capacitive sensors 50A-50E, the sheet 32 may be formed of a light transmissive material and the capacitive sensors 50A-50E may be formed of a visually transparent material, such as indium tin oxide (ITO), so as to allow light to pass therethrough and onto the sheet 60 and through the light transparent portions to illuminate the characters 62.

The flexible tape 32 may be adhered on the paint or sheet 60 with an adhesive. Similarly, the circuit board 30 may be adhered onto the exterior surface of the trim panel 28 with an adhesive layer 35.

Figure 8:
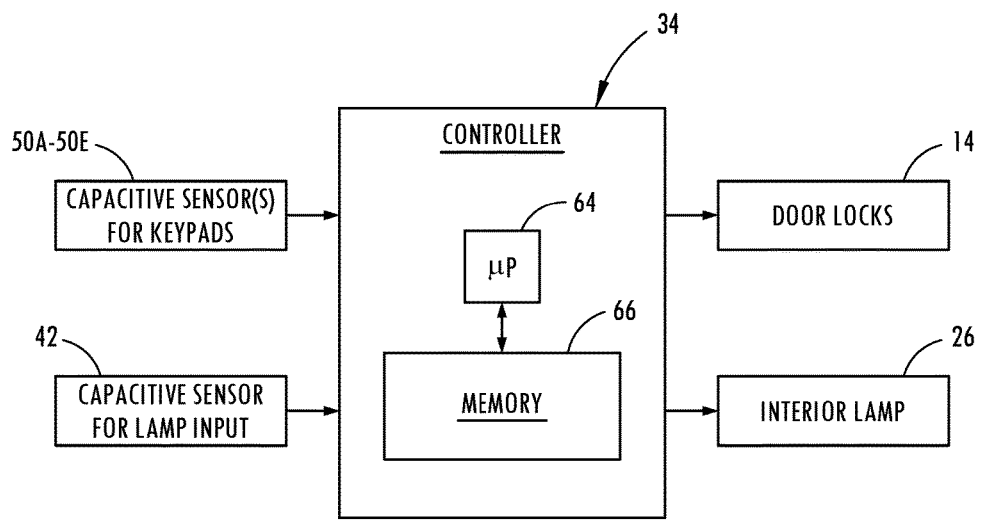
FIG. 8 is a block diagram illustrating controls for processing keypad and light inputs and controlling the door locks and interior light.

Referring to FIG. 8, the controller 34 for controlling the door lock 70 and interior lamp 26 are illustrated. The controller 34 may include a microprocessor 64 and memory 66. It should be appreciated that the controller 34 may include any analog and/or digital circuitry. The controller 34 receives signals from each of the capacitive sensors 50A-50E of the keypads 22A-22E and, based on the user input sequence relative to a stored code, may lock or unlock the door lock 14 on the vehicle. Additionally, the controller 34 receives an input from the capacitive sensor 42 for controlling the lamp input and may control the interior lamp 26 to turn the lamp on and off.

Accordingly, the input keypad assembly 20 advantageously provides for keypads accessible on the exterior of a vehicle to allow access to the vehicle using proximity sensors and also provides an interior lamp to illuminate the interior of the vehicle.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. An input keypad assembly on a vehicle, comprising:
a keypad comprising a plurality of proximity sensors mounted between a vehicle body member and a circuit board and connected to the circuit board, the keypad configured to receive a user input on an exterior of the vehicle; and
a lamp mounted on the circuit board and configured to illuminate light in an interior of the vehicle.

2. The input keypad assembly of claim 1, wherein the body member comprises a window.

3. The input key assembly of claim 2, wherein the input keypad assembly is located in a frit region of the window.

4. The input keypad assembly of claim 1, wherein the plurality of proximity sensors are positioned on a surface of the vehicle body member.

5. The input keypad assembly of claim 4, wherein the plurality of proximity sensors comprises a plurality of capacitive sensors.

6. The input keypad assembly of claim 5, wherein each of the capacitive sensors comprises a first plurality of electrode fingers interlaced with a second plurality of electrode fingers.

7. The input keypad assembly of claim 1, wherein the keypad is employed to control operation of a door lock to lock or unlock a vehicle door.

8. The input keypad assembly of claim 1 further comprising a character region viewable from the exterior of the vehicle for providing an illuminated character for identifying pads of the keypad.

9. The input keypad assembly of claim 8 further comprising a circuit board, wherein the lamp comprises a first light source assembled on the circuit board.

10. The input keypad assembly of claim 9 further comprising a second light source assembled on the circuit board and located behind the character region for backlighting the character region.

11. An input keypad assembly on a vehicle comprising:
a circuit board located on a vehicle body member;
a keypad comprising a plurality of proximity sensors mounted between the body member and a first side of the circuit board and configured to receive a user input on an exterior of the vehicle; and
a lamp mounted on the circuit board and configured to illuminate light in the interior of the vehicle.

12. The input keypad assembly of claim 11, wherein the body member comprises a window.

13. The input key assembly of claim 12, wherein the input keypad assembly is located in a fit region of the window.

14. The input keypad assembly of claim 11, wherein the plurality of proximity sensors are positioned on a surface of the vehicle body member.

15. The input keypad assembly of claim 14, wherein the plurality of proximity sensors comprises a plurality of capacitive sensors.

16. The input keypad assembly of claim 15, wherein each of the capacitive sensors comprises a first plurality of electrode fingers interlaced with a second plurality of electrode fingers.

17. The input keypad assembly of claim 11, wherein the keypad is employed to control operation of a door lock to lock or unlock a vehicle door.

18. The input keypad assembly of claim 11 further comprising a character region viewable from the exterior of the vehicle for providing an illuminated character for identifying pads of the keypad.

19. The input keypad assembly of claim 17, wherein the lamp comprises a first light source assembled on the circuit board and arranged to illuminate light outward from a second side of the circuit board.

20. The input keypad assembly of claim 18 further comprising a second light source assembled on the circuit board and located behind the character region for backlighting the character region.

* * * * *